(12) United States Patent
Lee

(10) Patent No.: US 8,143,139 B2
(45) Date of Patent: Mar. 27, 2012

(54) METHOD OF FABRICATING EXTENDED DRAIN MOS TRANSISTOR

(75) Inventor: Kyoung-Jin Lee, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 763 days.

(21) Appl. No.: 12/197,331

(22) Filed: Aug. 25, 2008

(65) Prior Publication Data

US 2009/0057785 A1 Mar. 5, 2009

(30) Foreign Application Priority Data

Aug. 29, 2007 (KR) .................. 10-2007-0086997

(51) Int. Cl.
  *H01L 21/762* (2006.01)
  *H01L 29/78* (2006.01)
(52) U.S. Cl. ............... 438/443; 257/408; 257/E21.552; 257/E29.266
(58) Field of Classification Search .................. 438/736, 438/232
  See application file for complete search history.

(56) References Cited

U.S. PATENT DOCUMENTS

| 4,502,203 | A | * | 3/1985 | Nishizawa et al. | 438/57 |
| 5,933,722 | A | * | 8/1999 | Hong | 438/232 |
| 6,573,030 | B1 | * | 6/2003 | Fairbairn et al. | 430/323 |
| 7,262,471 | B2 | | 8/2007 | Pan et al. | |
| 2004/0043623 | A1 | * | 3/2004 | Liu et al. | 438/736 |
| 2006/0220124 | A1 | | 10/2006 | Ohtake | |
| 2008/0121985 | A1 | | 5/2008 | Chen et al. | |

FOREIGN PATENT DOCUMENTS

| JP | 2002-190599 | 7/2002 |
| JP | 2006-286953 | 10/2006 |
| KR | 10-2008-0041588 | 5/2008 |

* cited by examiner

*Primary Examiner* — David Vu
*Assistant Examiner* — Jonathan Han
(74) *Attorney, Agent, or Firm* — Sherr & Vaughn, PLLC

(57) ABSTRACT

A method of fabricating an extended drain MOS transistor which reduces a design rule and prevents the generation of leakage current. The method includes sequentially forming a diffusion film, a first conductive epitaxial layer, a gate oxide layer and a hard mask layer over a semiconductor substrate, forming a first hard mask pattern having a first thickness by performing a first etching process on the hard mask layer, forming a second hard mask pattern having a second thickness by performing a second etching process on the first hard mask layer, and then forming a thin gate oxide layer by performing a third etching process on the gate oxide layer using the second hard mask pattern as a mask.

17 Claims, 5 Drawing Sheets

METHOD OF FABRICATING EXTENDED DRAIN MOS TRANSISTOR

Figure 1:
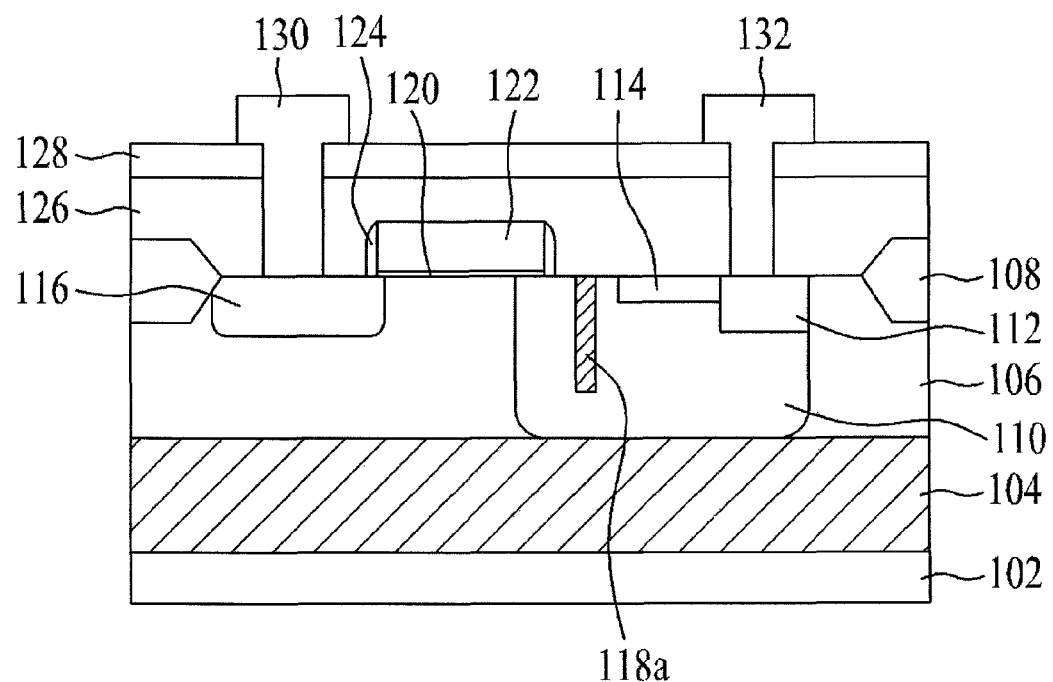

The present application claims priority under 35 U.S.C. §119 to Korean Patent Application No. 10-2007-0086997 (filed on Aug. 29, 2007), which is hereby incorporated by reference in its entirety.

BACKGROUND

Generally, there are MOS transistors having various types. Among various MOS transistors, an extended drain metal oxide semiconductor field effect transistor (hereinafter, referred to as "an extended drain MOS transistor") having an extended drain region to enhance breakdown voltage (hereinafter, referred to as "BV") of the transistor element has been developed. Particularly, such an extended drain MOS transistor has been widely used in high voltage applying conditions. First, a p-type well and an n-type drain region, which are separated from each other, are disposed on and/or over a semiconductor substrate having an active region restricted by an isolation layer. A source region is disposed on and/or over the p-type well. An upper portion of the p-type well, which is adjacent to the source region and is overlapped with a gate insulating film and a gate conductive film, is a channel region. The drain region is disposed on and/or over an extended drain region. The gate insulating film and the gate conductive film are sequentially stacked on and/or over the channel region, and a gate spacer film is formed on and/or over the side wall of the gate conductive film. A first ion implantation process is performed before formation of the gate spacer film and a second ion implantation process is performed after formation of the gate spacer film, and thus, a DMOS transistor structure is obtained through double diffusion. The source region and the drain region are electrically connected to source and drain electrodes respectively through general wiring.

As described above, in such an extended drain MOS transistor, the extended drain region is formed to prevent the destruction of the element at a high voltage. Here, the extended drain region increases the size of the element and generates leakage current between the source and drain regions.

SUMMARY

Embodiments relate to a semiconductor element and more particularly, to a method of fabricating an extended drain MOS transistor which reduces a design rule and prevents the generation of leakage current.

Embodiments relate to a method of fabricating an extended drain MOS transistor that may include at least one of the following steps: forming a diffusion under film on and/or over a semiconductor substrate; and then forming a first conductive epitaxial layer on and/or over the diffusion under film; and then forming a gate oxide layer on and/or over the first conductive epitaxial layer; and then forming a thin gate oxide layer by patterning the gate oxide layer; and then forming a second conductive epitaxial layer including the thin gate oxide layer on the first conductive epitaxial layer.

Embodiments relate to a method for fabricating an extended drain MOS transistor that may include at least one of the following steps: forming a diffusion under film on and/or over a semiconductor substrate; and then forming a first conductive epitaxial layer on and/or over the diffusion under film; and then forming a gate oxide layer on and/or over the first conductive epitaxial layer; and then forming a hard mask layer on and/or over the first conductive epitaxial layer; and then forming a first hard mask pattern by etching the hard mask layer; and then forming a second hard mask pattern which is thinner than the first hard mask pattern by patterning the first hard mask pattern by etching; and then forming a thin gate oxide layer by etching the gate oxide layer using the second hard mask pattern as a mask; and then forming a second conductive epitaxial layer including the thin gate oxide layer on and/or over the first conductive epitaxial layer.

Embodiments relate to an apparatus that may include at least one of the following: a semiconductor substrate; a diffusion film formed over the semiconductor substrate; a first conductive layer formed over the diffusion film; a second conductive layer formed in the first conductive layer; a source region formed in the first conductive layer; a drain region formed in the second conductive layer; a threshold voltage adjustment implant formed adjacent to the drain region in the second conductive layer; and a thin gate oxide layer formed in the second conductive layer.

Embodiments relate to a method that may include at least one of the following steps: sequentially forming a diffusion film, a first conductive epitaxial layer, a gate oxide layer and a hard mask layer over a semiconductor substrate; and then forming a first hard mask pattern having a first thickness by performing a first etching process on the hard mask layer; forming a second hard mask pattern having a second thickness by performing a second etching process on the first hard mask layer; forming a thin gate oxide layer by performing a third etching process on the gate oxide layer using the second hard mask pattern as a mask.

DRAWINGS

Example FIGS. 1 to 3 illustrate an extended drain MOS transistor and a method of fabricating an extended drain MOS transistor in accordance with embodiments.

DESCRIPTION

As illustrated in example FIG. 1, the extended drain MOS transistor in accordance with embodiments may include lower diffusion film 104 formed on and/or over semiconductor substrate 102 having isolation layer 108 formed thereon and/or thereover, first conductive layer 106 formed on and/or over lower diffusion film 104, second conductive layer 110 formed in first conductive layer 106, source region 116 formed in first conductive layer 106, drain region 112 formed in the second conductive layer 110, implant 114 for threshold voltage adjustment formed at one side of drain region 112 of second conductive layer 110, gate insulating film 120 formed on and/or over a channel region between source region 116 and drain region 112, gate electrode 122 formed on and/or over gate insulating film 120, gate spacer 124 formed on sidewalls of gate insulating film 120 and gate electrode 122, thin gate oxide layer 118a formed in second conductive layer 110, BPSG insulating film 126 formed on and/or over the entire surface of semiconductor substrate 102, TEOS film 128 formed on and/or over BPSG insulating film 126, and source contact 130 and drain contact 132 passing through BPSG insulating film 126 and TEOS film 128 and contacting source region 116 and drain region 112.

In accordance with embodiments, such an extended drain MOS transistor having thin gate oxide layer 118a formed in an extended drain region serves to prevent the breakdown of the transistor when a high voltage is applied to the transistor, i.e., second conductive layer 110, thereby reducing second conductive layer 110 and reducing a design rule. Moreover, snap-back generating a leakage current path between source region 116 and drain region 112 is reduced, and thus, break down voltage characteristics are raised and leakage current characteristics are enhanced.

Hereinafter, a process of fabricating a thin gate oxide layer formed in an extended drain region in the above extended drain MOS transistor will be described. Here, other processes of the extended drain MOS transistor, which are the same as typical extended drain MOS transistors, will be omitted.

Figure 2A:
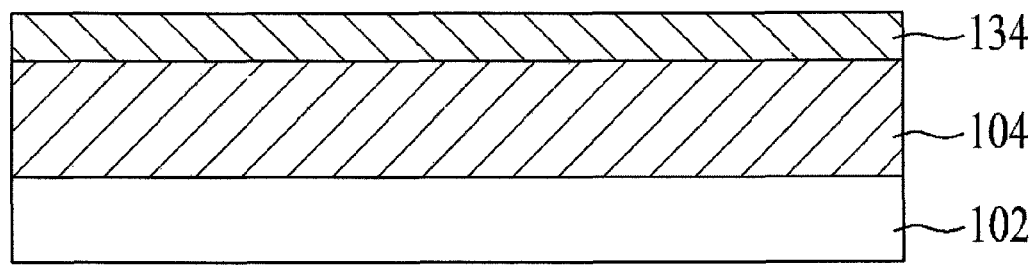

As illustrated in example FIG. 2A, lower diffusion film 104 is formed on and/or over surface of semiconductor substrate 102. Thereafter, first conductive epitaxial layer 134 is grown on and/or over lower diffusion film 104. First conductive epitaxial layer 134 is obtained by epitaxial growth.

Figure 2B:
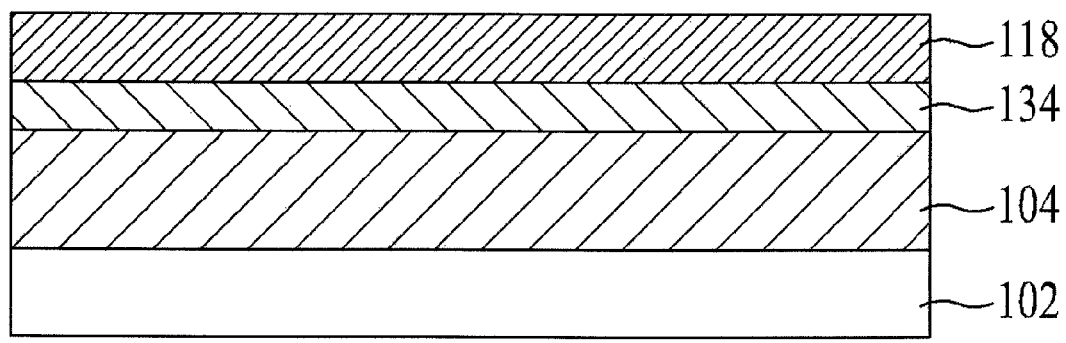

As illustrated in example FIG. 2B, gate oxide layer 118 is formed on and/or over first conductive epitaxial layer 134. Gate oxide layer 118 is formed by wet oxidation.

Figure 2C:
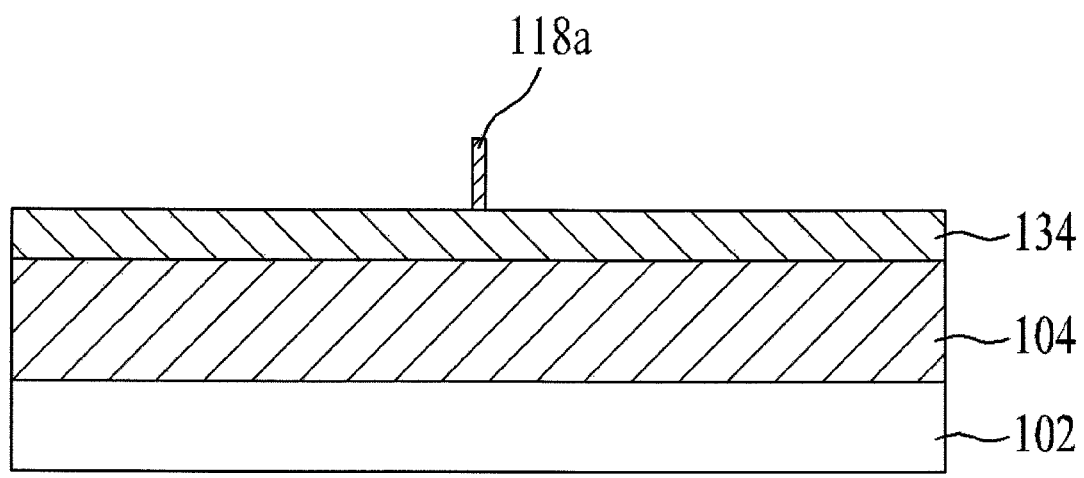

As illustrated in example FIG. 2C, thin gate oxide layer 118a is formed by patterning gate oxide layer 118 on and/or over first conductive epitaxial layer 134 by photolithography and etching.

Figure 2D:
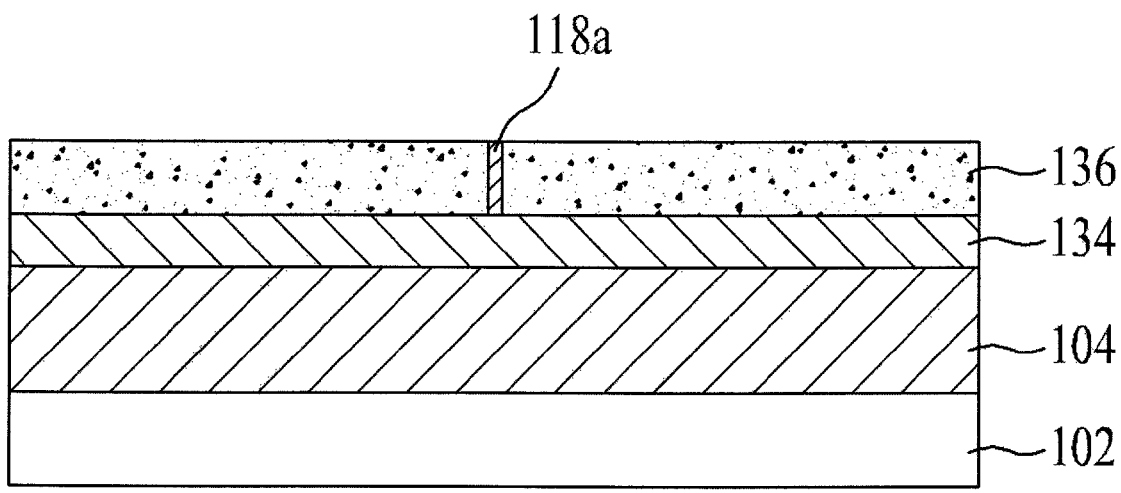

As illustrated in example FIG. 2D, second conductive epitaxial layer 136 selectively including thin gate oxide layer 118a is grown on and/or over first conductive epitaxial layer 134. Here, second conductive epitaxial layer 136 is formed by epitaxial growth. The extended drain MOS transistor formed by the above method includes thin gate oxide layer 118a formed in an extended drain region to prevent the breakdown of the transistor when a high voltage is applied to the transistor, and thereby increases threshold voltage and reduces the extended drain region and reducing a design rule.

Figure 3A:
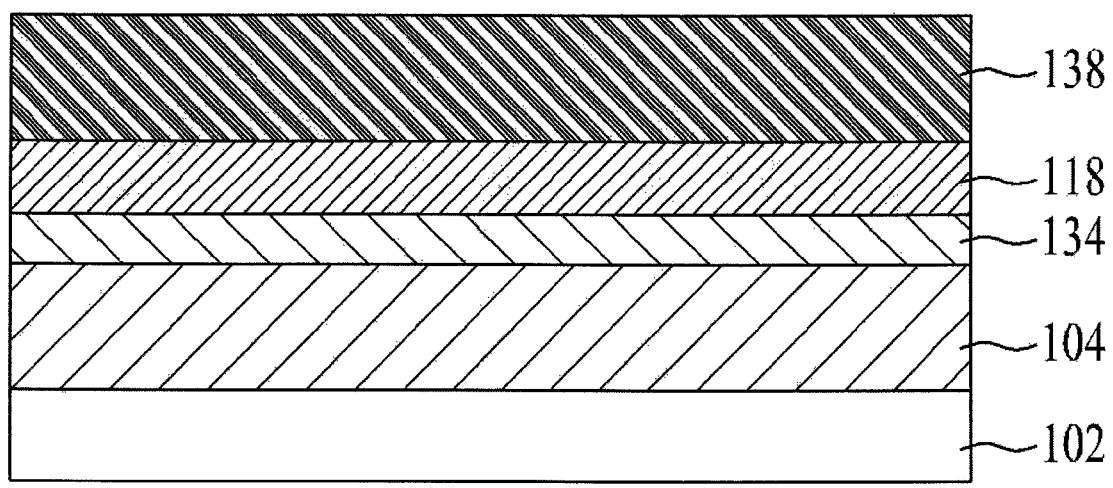

As illustrated in example FIG. 3A, lower diffusion film 104 is formed on and/or over semiconductor substrate 102. Thereafter, first conductive epitaxial layer 134 is grown on and/or over lower diffusion film 104. First conductive epitaxial layer 134 is obtained by epitaxial growth. Thereafter, gate oxide layer 118 is formed on and/or over first conductive epitaxial layer 134. Gate oxide layer 118 is formed by wet oxidation. Thereafter, hard mask layer 138 is formed on and/or over gate oxide layer 118. Hard mask layer 138 is composed of any one of $SiO_2$, SiN, and $Si_3N_4$ and formed by at least one of plasma enhanced chemical vapor deposition (PECVD), low pressure chemical vapor deposition (LPCVD) and atom layer deposition (ALD).

Figure 3B:
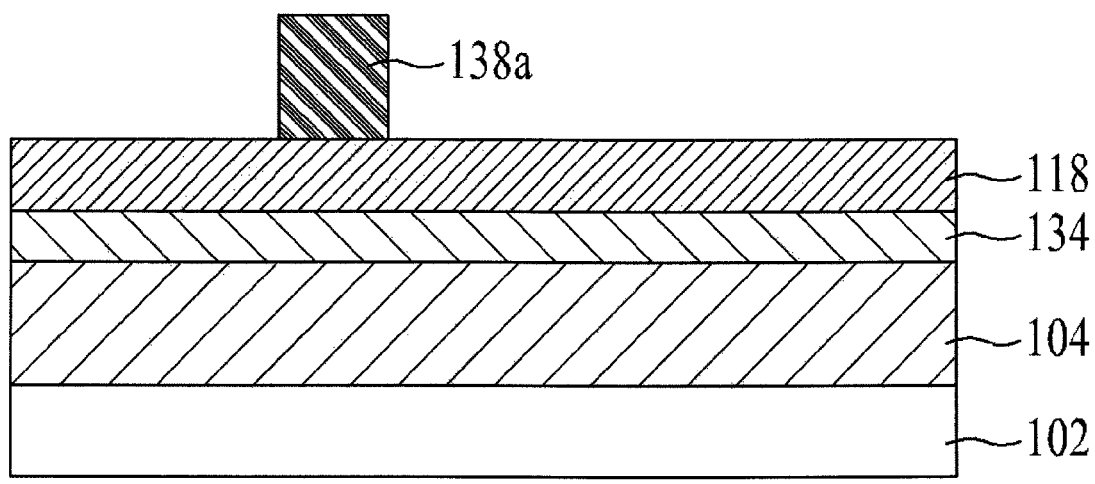

As illustrated in example FIG. 3B, first hard mask pattern 138a is formed by patterning hard mask layer 138 by photolithography and etching.

Figure 3C:
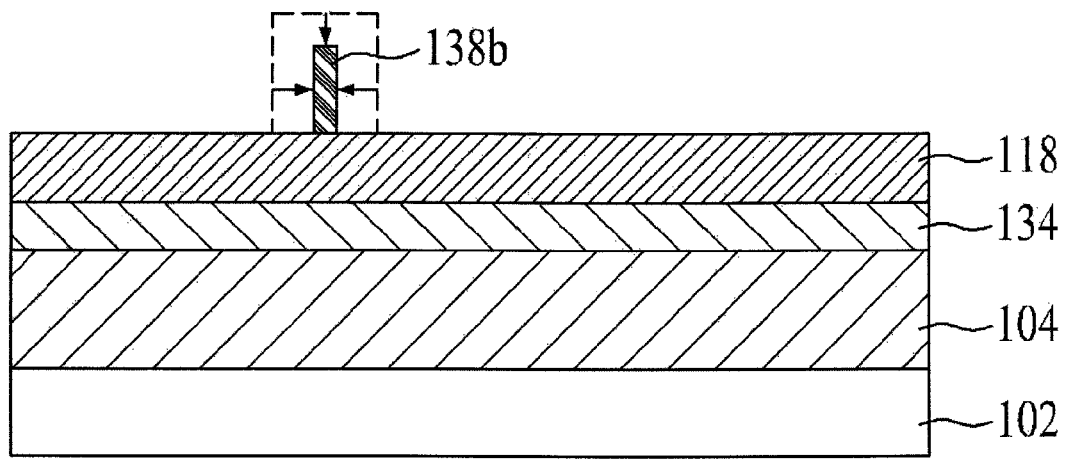

As illustrated in example FIG. 3C, second hard mask pattern 138b, which is thinner than first hard mask pattern 138a, is formed by patterning first hard mask pattern 138a by isotropic etching. The isotropic etching is performed using any one of PHF, BHF, and $H_3PO_4$.

Figure 3D:
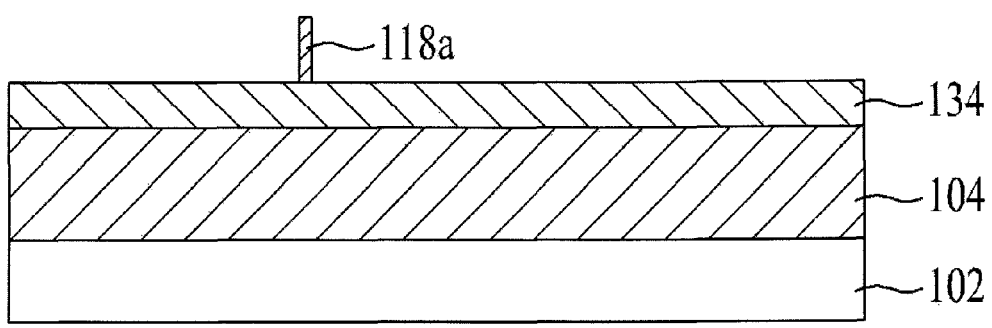

As illustrated in example FIG. 3D, thin gate oxide layer 118a is formed by patterning gate oxide layer 118 by photolithography and etching using second hard mask pattern 138b as a mask.

Figure 3E:
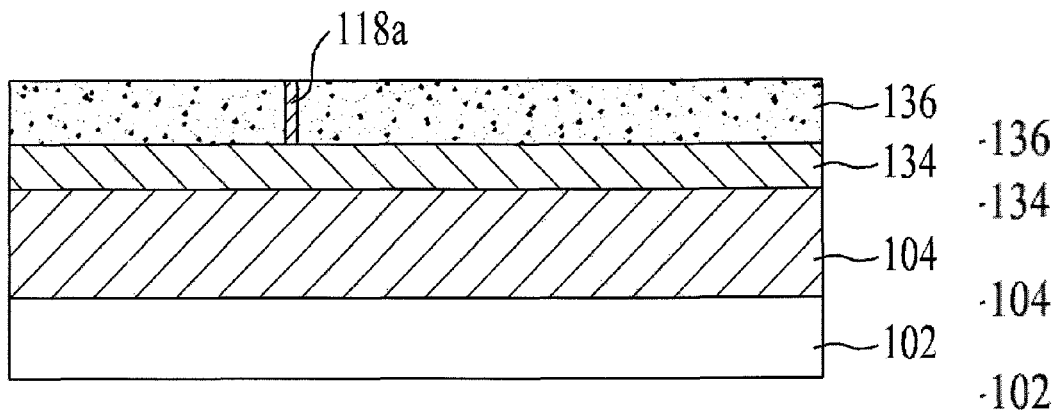

As illustrated in example FIG. 3E, second conductive epitaxial layer 136 selectively including thin gate oxide layer 118a is grown on and/or over first conductive epitaxial layer 134. Second conductive epitaxial layer 136 is formed by epitaxial growth. Thin gate oxide layer 118a is formed in extended drain region 110 including drain region 112 of the extended drain MOS transistor, and serves to reduce extended drain region 110. That is, a well including thin gate oxide layer 118 corresponding to extended drain region 110 is formed.

The above extended drain MOS transistor formed by the fabricating method in accordance with embodiments may include a gate oxide layer in an extended drain region, thus reducing the extended drain region and reducing a design rule. Further, snap-back generating a leakage current path between a source region and a drain region is reduced, and thus break down voltage characteristics are raised and leakage current characteristics are improved. The extended drain MOS transistor in accordance with embodiments includes a thin gate oxide layer formed in an extended drain region to prevent the breakdown of the transistor when a high voltage is applied to the transistor, thereby increases threshold voltage and reducing the extended drain region and a design rule. Further, snap-back generating a leakage current path between the source region and the drain region is reduced, and thus break down voltage characteristics are raised and leakage current characteristics are enhanced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating an extended drain MOS transistor comprising:
   forming a diffusion film on a semiconductor substrate; and then
   forming a first conductive epitaxial layer on the diffusion film; and then
   forming a gate oxide layer on the first conductive epitaxial layer; and then
   forming a thin gate oxide layer by patterning the gate oxide layer; and then
   forming a second conductive epitaxial layer on the first conductive epitaxial layer including the thin gate oxide layer, wherein the thin gate oxide layer vertically extends from a surface of the first conductive epitaxial layer through the second conductive epitaxial layer.

2. The method of claim 1, wherein the gate oxide layer is formed by wet oxidation.

3. The method of claim 1, wherein forming the thin gate oxide layer comprises:
   forming a hard mask layer on the first conductive epitaxial layer; and then
   forming a first hard mask pattern having a first width by etching the hard mask layer; and then
   forming a second hard mask pattern having a second width less than the first width by patterning the first hard mask pattern; and then
   etching the gate oxide layer using the second hard mask pattern as a mask.

4. The method of claim 3, wherein the hard mask layer is made of one selected from the group consisting of silicon dioxide ($SiO_2$) and silicon nitride (SiN).

5. The method of claim 4, wherein the hard mask layer is formed by one method selected from the group consisting of plasma enhanced chemical vapor deposition (PECVD), low pressure chemical vapor deposition (LPCVD) and atom layer deposition (ALD).

6. The method of claim 3, wherein the hard mask layer is formed by one method selected from the group consisting of plasma enhanced chemical vapor deposition (PECVD), low pressure chemical vapor deposition (LPCVD) and atom layer deposition (ALD).

7. The method of claim 3, wherein patterning the first hard mask pattern is performed by etching using one selected from the group consisting of PHF, BHF, and $H_3PO_4$.

8. The method of claim 3, wherein forming the second hard mask pattern is performed by patterning the first hard mask pattern by isotropic etching.

9. The method of claim 1, further comprising forming:
a well including the thin gate oxide layer corresponding to an extended drain region.

10. A method comprising:
sequentially forming a diffusion film, a first conductive epitaxial layer, a gate oxide layer and a hard mask layer over a semiconductor substrate; and then
forming a first hard mask pattern having a first thickness by performing a first etching process on the hard mask layer;
forming a second hard mask pattern having a second thickness by performing a second etching process on the first hard mask layer;
forming a thin gate oxide layer by performing a third etching process on the gate oxide layer using the second hard mask pattern as a mask,
forming a second conductive epitaxial layer on the first conductive epitaxial layer including the thin gate oxide layer, wherein the thin gate oxide layer vertically extends from a surface of the first conductive epitaxial layer through the second conductive epitaxial layer.

11. The method of claim 10, wherein the gate oxide layer is formed by wet oxidation.

12. The method of claim 10, wherein the hard mask layer is made of one selected from the group consisting of silicon dioxide ($SiO_2$) and silicon nitride (SiN).

13. The method of claim 10, wherein the hard mask layer is formed by at least one of plasma enhanced chemical vapor deposition (PECVD), low pressure chemical vapor deposition (LPCVD) and atom layer deposition (ALD).

14. The method of claim 10, wherein the second etching process comprises an isotropic etching process.

15. The method of claim 14, wherein the isotropic etching process uses any one of PHF, BHF, and $H_3PO_4$.

16. The method of claim 10, further comprising, after forming the thin gate oxide layer:
forming a second conductive epitaxial layer over the first conductive epitaxial layer including the thin gate oxide layer.

17. The method of claim 10, wherein the first thickness is greater than the second thickness.

* * * * *